United States Patent
Gianoulakis

(10) Patent No.: US 6,825,448 B2
(45) Date of Patent: Nov. 30, 2004

(54) LOW RESIDUAL-STRESS BRAZED TERMINAL FOR HEATER

(75) Inventor: Steven E. Gianoulakis, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/428,527

(22) Filed: May 1, 2003

(65) Prior Publication Data

US 2004/0217104 A1 Nov. 4, 2004

(51) Int. Cl.[7] .................................................. H05B 3/68
(52) U.S. Cl. .................... 219/443.1; 219/541; 219/544; 338/322
(58) Field of Search .......................... 219/443.1, 444.1, 219/541, 543, 544; 338/329; 29/611; 439/551, 584

(56) References Cited

U.S. PATENT DOCUMENTS

| | | | | |
|---|---|---|---|---|
| 3,851,753 A | * | 12/1974 | Lazzarini et al. | 198/498 |
| 4,493,982 A | * | 1/1985 | Romansky | 219/469 |
| 4,639,580 A | * | 1/1987 | Johnson | 219/541 |
| 4,658,118 A | * | 4/1987 | Kicherer et al. | 219/458.1 |
| 4,941,249 A | * | 7/1990 | Gellert | 29/611 |
| 5,122,639 A | * | 6/1992 | Kicherer et al. | 219/458.1 |
| 5,756,972 A | * | 5/1998 | Vranicar et al. | 219/541 |
| 5,862,585 A | * | 1/1999 | Tessier | 29/618 |
| 5,924,893 A | * | 7/1999 | Eidsvig | 439/551 |
| 5,928,539 A | * | 7/1999 | Thivet | 219/267 |
| 6,035,101 A | | 3/2000 | Sajoto et al. | |
| 6,089,912 A | * | 7/2000 | Tallis et al. | 439/584 |
| 6,276,325 B1 | * | 8/2001 | Arlton | 123/145 A |
| 2003/0080110 A1 | * | 5/2003 | Hiramatsu et al. | 219/466.1 |

* cited by examiner

*Primary Examiner*—Cheryl J. Tyler
*Assistant Examiner*—L Fastovsky
(74) *Attorney, Agent, or Firm*—Townsend & Townsend & Crew

(57) ABSTRACT

Embodiments of the present invention are directed to relieving the stresses caused by a mismatch in the coefficients of thermal expansion in the components forming the connections at the terminals of a heater. In one embodiment, a heater comprises a heater body having an electrical heating element and a bottom surface, and a rod configured to be coupled with an electrical power source. A plug has a first end which is coupled to the heater body and extends into the heater body through the bottom surface of the heater body, and which is electrically connected with the electrical heating element. The plug has a second end which includes a cavity to receive a portion of the rod. The cavity is surrounded by a slotted side wall of the plug which is disposed outside of the heater body and includes a plurality of slots extending from the second end toward the bottom surface of the heater body and terminating near the bottom surface but before reaching the bottom surface. The slotted side wall is connected with the rod received into the cavity. The rod and the plug have different coefficients of thermal expansion.

20 Claims, 2 Drawing Sheets

LOW RESIDUAL-STRESS BRAZED TERMINAL FOR HEATER

CROSS-REFERENCES TO RELATED APPLICATIONS

Not applicable

BACKGROUND OF THE INVENTION

This invention relates generally to heaters and, more particularly, to terminals for heaters used in semiconductor manufacturing.

One of the primary steps in the fabrication of modern semiconductor devices is the formation of a thin film on a semiconductor substrate by chemical reaction of gases. Such a deposition process is referred to as chemical vapor deposition (CVD). Conventional thermal CVD processes supply reactive gases to the substrate surface where heat-induced chemical reactions can take place to produce the desired film. Plasma enhanced CVD processes promote the excitation and/or dissociation of the reactant gases by the application of radio frequency (RF) energy to the reaction zone proximate the substrate surface thereby creating a plasma of highly reactive species. The high reactivity of the released species reduces the energy required for a chemical reaction to take place, and thus lowers the required temperature for such CVD processes.

The substrate rests on a substrate support during processing in the chamber such as the formation of a layer on the substrate. The substrate support typically is a substrate heater which supports and heats the substrate during substrate processing. The substrate rests above the heater surface of the heater and heat is supplied to the bottom of the substrate. Some substrate heaters are resistively heated, for example, by electrical heating elements such as resistive coils disposed below the heater surface or embedded in a plate having the heater surface. The heat from the substrate heater is the primary source of energy in thermally driven processes such as thermal CVD for depositing layers including undoped silicate glass (USG), doped silicate glass (e.g., borophosphosilicate glass (BPSG)), and the like.

In a typical heater, a heating element such as a resistive coil is embedded in a heater body which may be made of a ceramic, a metal, or the like. To connect the heating element to a power source, heater terminals are provided between the interior and the exterior of the heater body. In a typical terminal, a plug is inserted into the heater body to connect to the heating element. A rod is connected to the plug from outside the heater body, typically by brazing, and is coupled with a power source. The electrical current flows from the power source through the heating element via the rod and plug connection. The rod and the plug are often made of different materials having different coefficients of thermal expansion. The differential thermal expansion and contraction of the rod and plug during brazing, for example, produces residual stresses in the heater terminal, which can lead to failure.

BRIEF SUMMARY OF THE INVENTION

Embodiments of the present invention are directed to relieving the stresses caused by a mismatch in the coefficients of thermal expansion in the components forming the connections at the terminals of a heater. The connection is typically formed by inserting a rod which is connected to a power source into the cavity of a plug which is connected to the heating element in the heater body. The rod is typically connected to the plug by a brazed joint, and may further include a threaded connection. Stress relief slots are formed on the side wall of the plug around the cavity for receiving the rod. When the terminal is heated and then cooled during brazing, the slotted side wall of the plug can flex to avoid residual stress buildup in the braze material between the plug and the rod caused by differences in expansion and contraction between the plug and the rod.

In accordance with an aspect of the present invention, a heater comprises a heater body having an electrical heating element and a bottom surface, and a rod configured to be coupled with an electrical power source. A plug has a first end which is coupled to the heater body and extends into the heater body through the bottom surface of the heater body, and which is electrically connected with the electrical heating element. The plug has a second end which includes a cavity to receive a portion of the rod. The cavity is surrounded by a slotted side wall of the plug which is disposed outside of the heater body and includes a plurality of slots extending from the second end toward the bottom surface of the heater body and terminating near the bottom surface but before reaching the bottom surface. The slotted side wall is connected with the rod received into the cavity. The rod and the plug have different coefficients of thermal expansion.

In some embodiments, the slotted side wall of the plug has at least three slots extending from the second end toward the bottom surface. The slotted side wall of the plug may have four slots which are spaced about 90 degrees apart. The rod typically has a higher coefficient of thermal expansion than the plug. The portion of the rod received into the cavity of the plug is brazed to the slotted side wall of the plug with a braze material, or is threadingly coupled to the slotted side wall of the plug, or both.

In accordance with another aspect of the invention, a heater comprises a heater body having an electrical heating element and a bottom surface, and a rod configured to be coupled with an electrical power source. A plug has a first end which is coupled to the heater body and extends into the heater body through the bottom surface of the heater body, and which is electrically connected with the electrical heating element. The plug has a second end which includes a cavity to receive a portion of the rod. The cavity is surrounded by a slotted side wall of the plug which is disposed outside of the heater body and includes a plurality of slots extending from the second end toward the bottom surface of the heater body generally in an axial direction along an axis of the plug. The plug has an exposed length from the second end to the bottom surface of the heater surface. The slots are substantially longer than half the exposed length of the plug and terminating before reaching the bottom surface. The slotted side wall is connected with the rod received into the cavity. The rod and the plug have different coefficients of thermal expansion.

Another aspect of the present invention is directed to a method of forming a heater terminal for a heater which includes a heater body having an electrical heating element. The method comprises inserting a first end of a plug through a surface of the heater body into the heater body to electrically connect the plug with the electrical heating element. The plug has a second end which includes a cavity surrounded by a slotted side wall which is disposed outside of the heater body. The slotted side wall includes a plurality of slots extending from the second end toward the surface of the heater body generally in an axial direction along an axis of the plug. The plug has an exposed length from the second end to the bottom surface of the heater surface. The slots are substantially longer than half the exposed length of the plug and terminating before reaching the bottom surface. The method further comprises inserting a rod which is configured to be coupled with an electrical power source into the cavity at the second end of the plug and connecting the rod with the slotted side wall of the plug. The rod and the plug have different coefficients of thermal expansion.

DETAILED DESCRIPTION OF THE INVENTION

Figure 1:
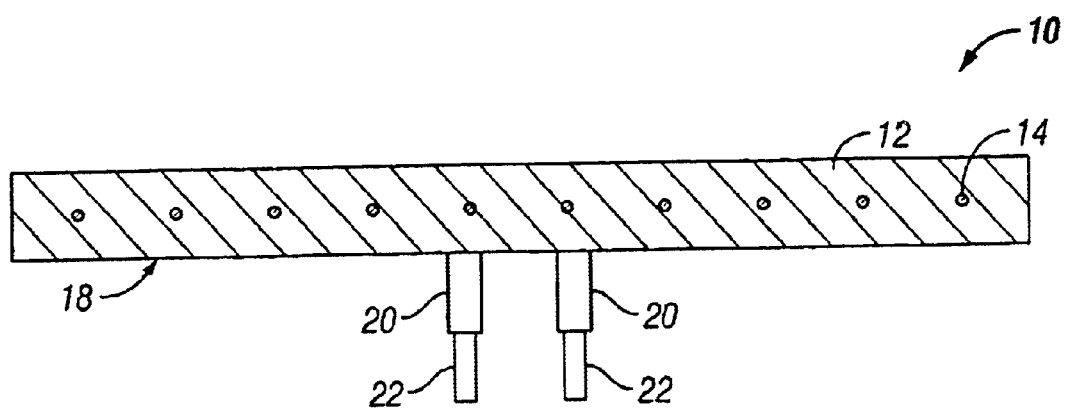
FIG. 1 is a simplified cross-sectional view of a heater according to an embodiment of the present invention.
Figure 2:
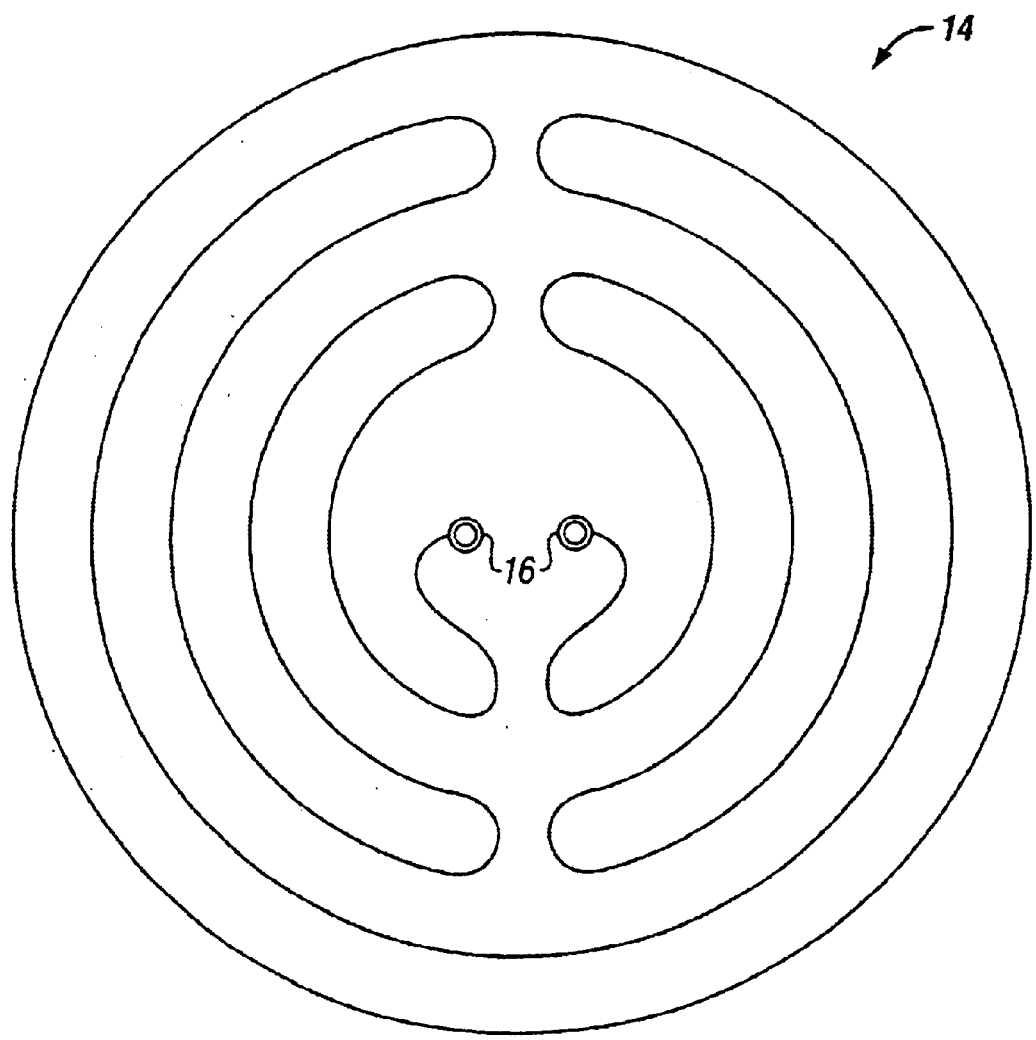
FIG. 2 is a simplified plan view of a heater element in the heater of FIG. 1.

FIG. 1 shows a heater 10 having a heater body 12 and an electrical heating element 14 disposed in the heater body 12. FIG. 2 shows an example of a heating element 14 which is a heating coil having a number of turns. The heating element 14 may include an electrically resistive element of molybdenum or a stainless steel sheathed nichrome heating wire surrounded by an electrically insulative core, which may be magnesium oxide. The heating element 14 includes a pair of heating element stubs 16 for connecting to a power source. The heater body 12 may be formed of a ceramic material, such as aluminum nitride (ALN) or the like, or a metal such as copper, aluminum, or the like. As seen in FIG. 1, a pair of plugs 20 are inserted through a bottom surface 18 partially into the heater body 12 to be connected with the stubs 16 of the heating element 14. A pair of rods 22 are connected with the pair of plugs 20, respectively, to form the terminals for the heater 10. The rods 22 are configured to be coupled with a power source to supply a current to the heating element 14.

Figure 3:
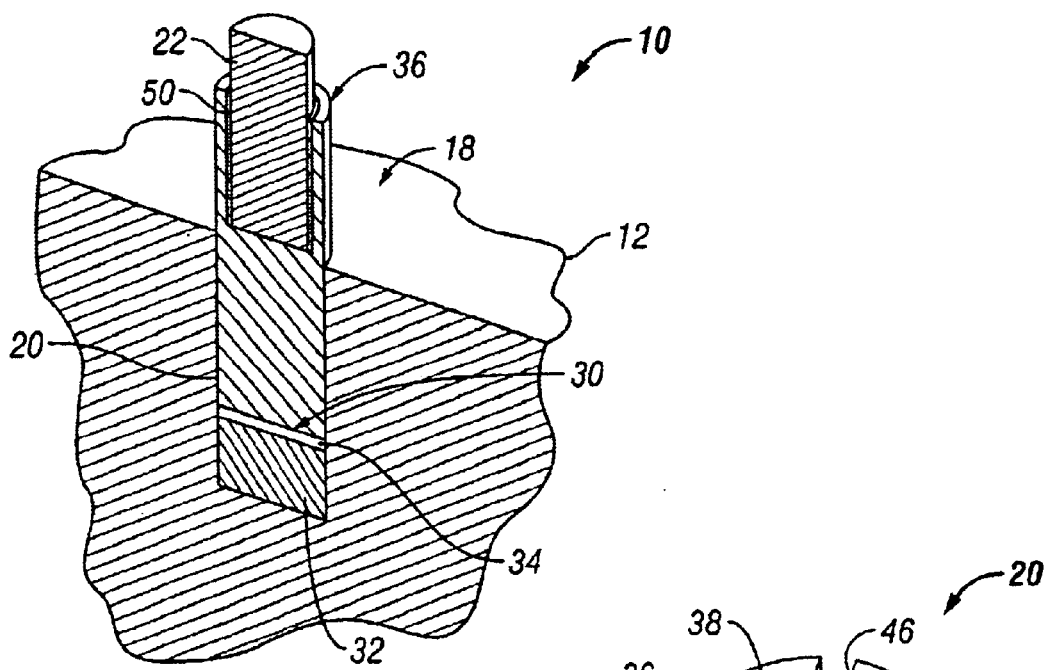
FIG. 3 is a perspective view of a heater terminal in the heater of FIG. 1.
Figure 4:
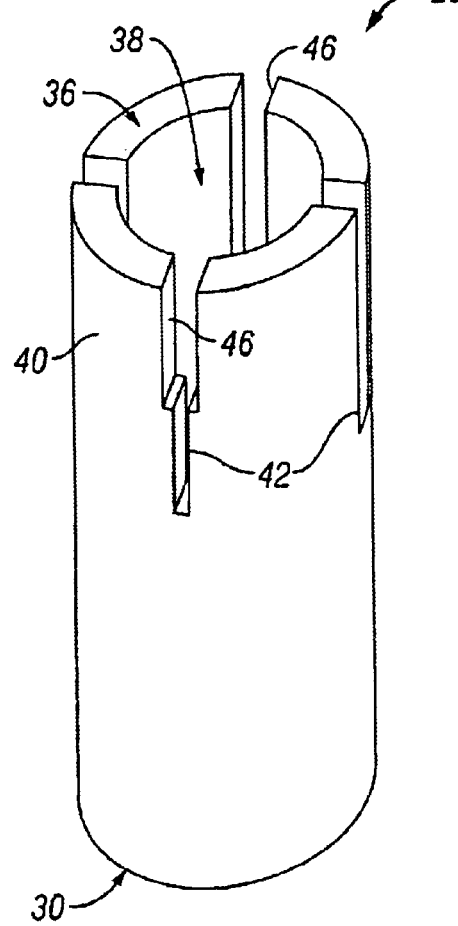
FIG. 4 is a perspective view of a plug in the heater terminal of FIG. 3.

One of the heater terminals is illustrated in greater detail in FIG. 3, which is shown inverted with the bottom surface 18 of the heater body 12 facing upward. The plug 20 has a first end 30 which is inserted into a cavity of the heater body 12. In the embodiment shown, a post 32 is first formed in the cavity, and the first end 30 is brazed to the post 32 with a braze material 34. The post 32 is connected to the stub 16 of the heating element 12, and conducts current between the plug 20 and the heating element 12. The plug 20 has a second end 36 which includes a cavity 38 that extends partially through the length of the plug 20 to receive a portion of the rod 22. As seen in FIGS. 3 and 4, the cavity 38 is surrounded by a slotted side wall 40 which is disposed outside the heater body 12. The slotted side wall 40 includes a plurality of slots 42 extending from the second end 36 toward the bottom surface 18 of the heater body 12. The slots 42 extend generally in an axial direction along the axis of the plug 20. The slotted side wall 40 has an exposed length measured from the second end 36 to the bottom surface 18 of the heater body 12. The slots 42 desirably are substantially longer than half the exposed length of the plug 20 and terminate before reaching the bottom surface 18. In the embodiment shown, the slots 42 terminate near the bottom surface 18. The cavity 38 of the plug 20 also terminates near the bottom surface 18 of the heater body 12.

The slots 42 desirably are of sufficient number and size to allow the slotted side wall 40 of the plug 20 to flex. For the circular plug 20, there are typically at least three slots 42, more desirably four or more slots 42. In FIG. 4, four slots 42 are spaced about 90 degrees apart. The slots 42 are typically about 50 μm in width, and may be uniform or may vary in width. In the embodiment shown, two of the four slots 42 begin as screw driver slots 46 at the second end 36, and then extend further toward the bottom surface 18 of the heater body 12. The screw driver slots 46 are about 3 mm in length, while the overall slots 42 are about 6 mm in length measured from the second end 36. The exposed length of the plug 20 is slightly more than 6 mm (e.g., 6.2–6.5 mm). The length of the plug 20 is about 10–12 mm. The slots 42 may have other widths and there may be more than four slots, as long as the mechanical strength of the slotted side wall 40 is not reduced so much as to comprise the reliability and integrity of the terminal connection. There desirably is adequate contact area between the plug 20 and the rod 22 to provide sufficient current flow therebetween.

The portion of the rod 22 received into the cavity 38 of the plug 20 is preferably brazed to the slotted side wall 40 of the plug 20 with a braze material 50 disposed therebetween. The inserted portion of the rod 22 may be threadingly coupled to the slotted side wall 40 of the plug 20. In some embodiments, the inserted portion of the rod 22 is both brazed and threadingly coupled to the slotted side wall 40 of the plug 20. The brazed coupling generally ensures adequate contact for current flow as well as mechanical connection between the plug 20 and the rod 22, while the threaded coupling provides an enhanced mechanical connection between the plug 20 and the rod 22.

The plug 20 and the rod 22 are made of different materials having different coefficients of thermal expansion. In one example, the plug 20 is made of tungsten and the heater body 12 is made of aluminum nitride (AlN). Tungsten can withstand high temperatures during operation of the heater 10, and has a coefficient of thermal expansion very close to that of AlN to avoid stress buildup due to thermal cycling in the connection between the tungsten plug 20 and the AlN heater body 12. The post 32 disposed between the plug 20 and the electrical element 14 may be made of tungsten carbide, which has a coefficient of thermal expansion close to those of AlN and tungsten. The tungsten plug 20 is desirably coated with nickel which protects the tungsten from oxidation. The rod 22 is made of nickel which is resistant to oxidation and high temperature conditions. The nickel rod 22 has a higher coefficient of thermal expansion than the tungsten plug 20.

To form the brazed connection between the rod 22 and the plug 20, the terminal is heated to the braze temperature of the braze material 50 for several minutes after inserting the portion of the rod 22 into the cavity 38 of the plug 20. Examples of the braze material include copper-gold (Cu—Ag) paste or powder, or the like. The braze temperature may be about 1000° C., while the heater 10 may typically operate at about 450–650° C., and typically about 540° C., during semiconductor processing. At the braze temperature, the rod 22 expands more than the plug 20. The slotted side wall 40 of the plug 20 flexes outward due to the presence of the slots 42 to accommodate the expansion of the rod 22. When the terminal is cooled from the braze temperature, the rod 22 contracts and the slotted side wall 40 of the plug 20 flexes inward. As a result, the residual stress in the braze material 50 is significantly reduced. If the side wall of the plug 20 is not slotted, the contraction of the rod 22 will introduce tensile residual stress in the braze material 50, which may lead to failure of the brazed connection. Therefore, the slots 42 provide stress relief to the plug 20 to accommodate the mismatch of the coefficient of thermal expansion between the plug 20 and the rod 22. This avoids or reduces residual stress buildup in the braze material 50 between the plug 20 and the rod 22 caused by differences in expansion and contraction between the two components.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A heater comprising:
    a heater body having an electrical heating element and a bottom surface;
    a rod configured to be coupled with an electrical power source; and
    a plug having a first end which is coupled to the heater body and extends into the heater body through the bottom surface of the heater body, and which is electrically connected with the electrical heating element, the plug having a second end which includes a cavity to receive a portion of the rod, the cavity being surrounded by a slotted side wall of the plug which is disposed outside of the heater body and includes a plurality of slots extending from the second end toward the bottom surface of the heater body and terminating near the bottom surface but before reaching the bottom surface, the slotted side wall being connected with the rod received into the cavity, the rod and the plug having different coefficients of thermal expansion.

2. The heater of claim 1 wherein the slotted side wall of the plug has at least three slots extending from the second end toward the bottom surface.

3. The heater of claim 2 wherein the slotted side wall of the plug has four slots which are spaced about 90 degrees apart.

4. The heater of claim 1 wherein the rod has a higher coefficient of thermal expansion than the plug.

5. The heater of claim 1 wherein the rod comprises nickel and the plug comprises tungsten.

6. The heater of claim 1 wherein the portion of the rod received into the cavity of the plug is brazed to the slotted side wall of the plug with a braze material.

7. The heater of claim 1 wherein the portion of the rod received into the cavity of the plug is threadingly coupled to the slotted side wall of the plug.

8. The heater of claim 1 wherein the plug is brazed to a tungsten carbide post which is disposed in the body of the heater and connected to the electrical heating element.

9. The heater of claim 1 wherein the slots extend generally in an axial direction along an axis of the plug.

10. The heater of claim 9 wherein the plug has an exposed length from the second end to the bottom surface of the heater surface, and wherein the slots are substantially longer than half the exposed length of the plug.

11. A heater comprising:
    a heater body having an electrical heating element and a bottom surface;
    a rod configured to be coupled with an electrical power source; and
    a plug having a first end which is coupled to the heater body and extends into the heater body through the bottom surface of the heater body, and which is electrically connected with the electrical heating element, the plug having a second end which includes a cavity to receive a portion of the rod, the cavity being surrounded by a slotted side wall of the plug which is disposed outside of the heater body and includes a plurality of slots extending from the second end toward the bottom surface of the heater body generally in an axial direction along an axis of the plug, the plug having an exposed length from the second end to the bottom surface of the heater surface, the slots being substantially longer than half the exposed length of the plug and terminating before reaching the bottom surface, the slotted side wall being connected with the rod received into the cavity, the rod and the plug having different coefficients of thermal expansion.

12. The heater of claim 11 wherein the rod has a higher coefficient of thermal expansion than the plug.

13. The heater of claim 11 wherein the portion of the rod received into the cavity of the plug is brazed to the slotted side wall of the plug with a braze material.

14. The heater of claim 11 wherein the portion of the rod received into the cavity of the plug is threadingly coupled to the slotted side wall of the plug.

15. A method of forming a heater terminal for a heater which includes a heater body having an electrical heating element, the method comprising:
    inserting a first end of a plug through a surface of the heater body into the heater body to electrically connect the plug with the electrical heating element, the plug having a second end which includes a cavity surrounded by a slotted side wall which is disposed outside of the heater body, the slotted side wall including a plurality of slots extending from the second end toward the surface of the heater body generally in an axial direction along an axis of the plug, the plug having an exposed length from the second end to the bottom surface of the heater surface, the slots being substantially longer than half the exposed length of the plug and terminating before reaching the bottom surface; and
    inserting a rod which is configured to be coupled with an electrical power source into the cavity at the second end of the plug and connecting the rod with the slotted side wall of the plug, the rod and the plug having different coefficients of thermal expansion.

16. The method of claim 15 wherein connecting the rod with the slotted side wall of the plug comprises brazing the portion of the rod received into the cavity of the plug to the slotted side wall of the plug with a braze material.

17. The method of claim 16 wherein brazing the portion of the rod to the slotted side wall of the plug comprises placing the braze material between the portion of the rod and the slotted side wall of the plug and heating the rod, the plug, and the braze material to a braze temperature of the braze material.

18. The method of claim 15 wherein connecting the rod with the slotted side wall of the plug comprises threadingly coupling the portion of the rod received into the cavity of the plug to the slotted side wall of the plug with a braze material.

19. The method of claim 15 wherein inserting the first end of the plug through the surface of the heater body into the heater body comprises brazing plug to a tungsten carbide post which is disposed in the body of the heater and connected to the electrical heating element.

20. The method of claim 15 wherein the rod has a higher coefficient of thermal expansion than the plug.

* * * * *